US008580692B2

(12) United States Patent  
Arnold et al.

(10) Patent No.: US 8,580,692 B2
(45) Date of Patent: Nov. 12, 2013

(54) FILM STACK INCLUDING METAL HARDMASK LAYER FOR SIDEWALL IMAGE TRANSFER FIN FIELD EFFECT TRANSISTOR FORMATION

(75) Inventors: John C. Arnold, North Chatham, NY (US); Sivananda K. Kanakasabapathy, Niskayuna, NY (US); Stefan Schmitz, Malta, NY (US); Yunpeng Yin, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 205 days.

(21) Appl. No.: 13/171,865

(22) Filed: Jun. 29, 2011

(65) Prior Publication Data

US 2013/0001749 A1 Jan. 3, 2013

(51) Int. Cl.
H01L 21/311 (2006.01)

(52) U.S. Cl.
USPC ............ 438/706; 257/618; 257/E21.314

(58) Field of Classification Search
USPC ............ 257/618, E21.314; 438/706
See application file for complete search history.

(56) References Cited

U.S. PATENT DOCUMENTS

| | | | |
|---|---|---|---|
| 6,424,011 B1* | 7/2002 | Assaderaghi et al. | 257/350 |
| 6,875,703 B1 | 4/2005 | Furukawa et al. | |
| 6,987,289 B2 | 1/2006 | Nowak | |
| 7,315,994 B2 | 1/2008 | Aller et al. | |
| 7,335,930 B2 | 2/2008 | Furukawa et al. | |
| 7,351,666 B2 | 4/2008 | Furukawa et al. | |
| 7,381,655 B2 | 6/2008 | Furukawa et al. | |
| 7,439,144 B2 | 10/2008 | Doris et al. | |
| 7,585,614 B2 | 9/2009 | Furukawa et al. | |
| 7,771,604 B2 | 8/2010 | Furukawa et al. | |
| 7,847,323 B2 | 12/2010 | Cheng et al. | |
| 2006/0024945 A1* | 2/2006 | Kim et al. | 438/618 |
| 2008/0200001 A1* | 8/2008 | Clavelier et al. | 438/305 |
| 2010/0248481 A1 | 9/2010 | Schultz | |
| 2011/0014786 A1 | 1/2011 | Sezginer et al. | |
| 2012/0244711 A1* | 9/2012 | Yin et al. | 438/703 |
| 2012/0329268 A1* | 12/2012 | Soda et al. | 438/631 |

* cited by examiner

Primary Examiner — Thomas L Dickey
(74) Attorney, Agent, or Firm — Cantor Colburn LLP; Matthew Zehrer

(57) ABSTRACT

A method for formation of a fin field effect transistor (Fin-FET) device includes forming a mandrel mask and a large feature (FX) mask on a metal hardmask layer of a film stack, the film stack including a silicon on insulator (SOI) layer located underneath the metal hardmask layer; etching the mandrel mask and the FX mask simultaneously into the metal hardmask layer; and etching the mandrel mask and the FX mask into the SOI layer using the etched metal hardmask layer as a mask.

18 Claims, 33 Drawing Sheets

2000

FORM MANDREL MASK ON METAL HARDMASK LAYER
2001

↓

FORM CUT MASK ON METAL HARDMASK LAYER
2002

↓

FORM LARGE FEATURE (FX) MASK ON METAL HARDMASK LAYER
2003

↓

ETCH MANDREL MASK, CUT MASK, AND FX MASK INTO METAL HARDMASK LAYER
2004

↓

ETCH MANDREL MASK, CUT MASK, AND FX MASK INTO SOI USING ETCHED METAL HARDMASK LAYER AS MASK
2005

US 8,580,692 B2

FILM STACK INCLUDING METAL HARDMASK LAYER FOR SIDEWALL IMAGE TRANSFER FIN FIELD EFFECT TRANSISTOR FORMATION

BACKGROUND

This disclosure relates generally to the field of semiconductor device fabrication, and more particularly to fabrication of devices including fin field effect transistors (FinFETs) by sidewall image transfer (SIT).

The need to remain cost and performance effective in the production of semiconductor devices has caused continually increasing device density in integrated circuits. To facilitate the increase in device density, new technologies are constantly needed to allow the feature size of such semiconductor devices to be reduced. The push for ever increasing device densities is particularly strong in complementary metal-oxide-semiconductor (CMOS) devices such as field effect transistors (FETs). FETs are used in many types of integrated circuit (IC) design (i.e., microprocessors, memory, etc.). Unfortunately, increased devices density of FETs may result in degradation of device performance or reliability.

One type of FET that has been proposed to facilitate increased device performances is the FinFET. In a FinFET, a vertical fin structure is defined to form the body of the transistor. The fin structures may be formed on a substrate including a silicon on insulator (SOI) substrate. Gates are then formed on both sides and optionally the top of the fin structures. The fin structures and/or gates may be defined by a technique referred to as sidewall image transfer (SIT). In one example of SIT, mandrels are formed on top of a thermal silicon oxide layer that is located above the SOI layer. A conformal SIT spacer is then formed over the mandrels, the spacer is etched back to expose the top surfaces of the mandrels, and the mandrels are removed, leaving the portion of the SIT spacer that was located on the mandrel sidewalls. During the SIT process, the thermal silicon oxide layer may be damaged. Any fluctuation in the thermal silicon oxide layer thickness at the end of the SIT process can result in erosion of the fin structure during subsequent processing steps. Eroded fins might be difficult to merge together during subsequent epitaxial processing. Further, for a replacement gate integration scheme, a relatively thin layer of thermal silicon oxide (e.g., from about 3 nanometers to about 5 nanometers thick) on top of the SOI is required, which requires strict control of the thermal oxide thickness variation during the SIT etching. In the case of SIT using a polysilicon mandrel, the thermal silicon oxide may be sloped after the polysilicon mandrel etch. In the case of SIT using an amorphous carbon mandrel, the thermal silicon oxide may be partially etched and/or damaged and result in thickness variations at the end of fin formation. Further, there is a risk that the thermal silicon oxide will be exposed during SIT spacer removal over etch, so there is a risk that the thermal silicon oxide will be punched through during subsequent processing steps.

BRIEF SUMMARY

In one aspect, a method for formation of a fin field effect transistor (FinFET) device includes forming a mandrel mask and a large feature (FX) mask on a metal hardmask layer of a film stack, the film stack including a silicon on insulator (SOI) layer located underneath the metal hardmask layer; etching the mandrel mask and the FX mask simultaneously into the metal hardmask layer; and etching the mandrel mask and the FX mask into the SOI layer using the etched metal hardmask layer as a mask.

In another method, a film stack for formation of a fin field effect transistor (FinFET) device includes a buried oxide (BOX) layer; a silicon on insulator (SOI) layer located on the BOX layer; a thermal silicon oxide layer located on top of the SOI layer; a metal hardmask layer located on top of the thermal silicon oxide layer; and an amorphous carbon layer located on top of the metal hardmask layer.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a method for FinFET formation using SIT and a film stack including a metal hardmask layer, and a film stack including a metal hardmask layer for SIT FinFET formation, are provided, with exemplary embodiments being discussed below in detail. FinFET formation may be performed by etching a plurality of masks, including a mandrel mask for SIT, into the metal hardmask layer, and using the etched metal hardmask layer to transfer the plurality of masks into the SOI simultaneously. The plurality of masks that are etched into the metal hardmask layer may include the mandrel mask used for SIT and a large feature (FX) mask. By transferring the plurality of masks into the SOI in a reduced number of etching steps, it is possible to maintain the integrity of the thermal silicon oxide layer that is located on top of the SOI. A cut mask (used to remove unnecessary features formed by previously applied masks) may be formed on the device after the mandrel and FX masks are etched into the SOI. Therefore, a more robust process window is available during the SIT process, including mandrel etch, spacer etch, and spacer removal steps. A device fabrication process using SIT and a film stack including a metal hardmask layer may be used to form FinFETs having a pitch of about 80 nanometers or less (about 40 nanometers or less in some exemplary embodiments) with a relatively high process yield, due to low thermal silicon oxide thickness variation. SIT in conjunction with a film stack including a metal hardmask layer may be used for both gate and fin SIT applications.

Figure 1:
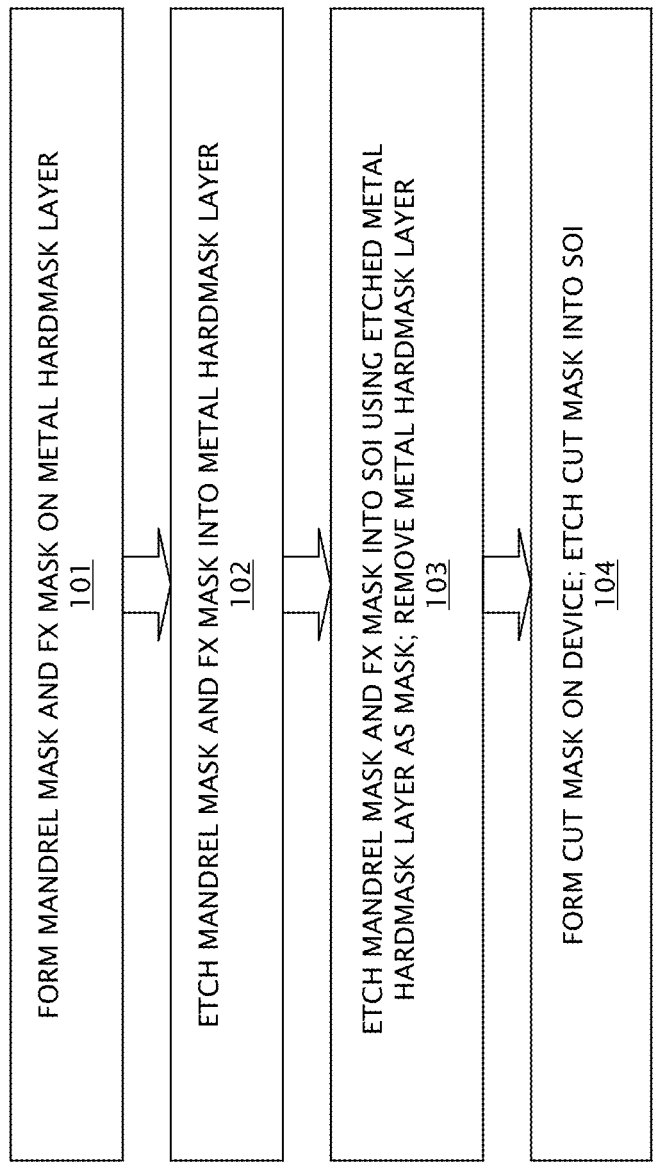
FIG. 1 illustrates a flowchart of an embodiment of a method for FinFET formation using SIT and a film stack including a metal hardmask layer.
Figure 2:
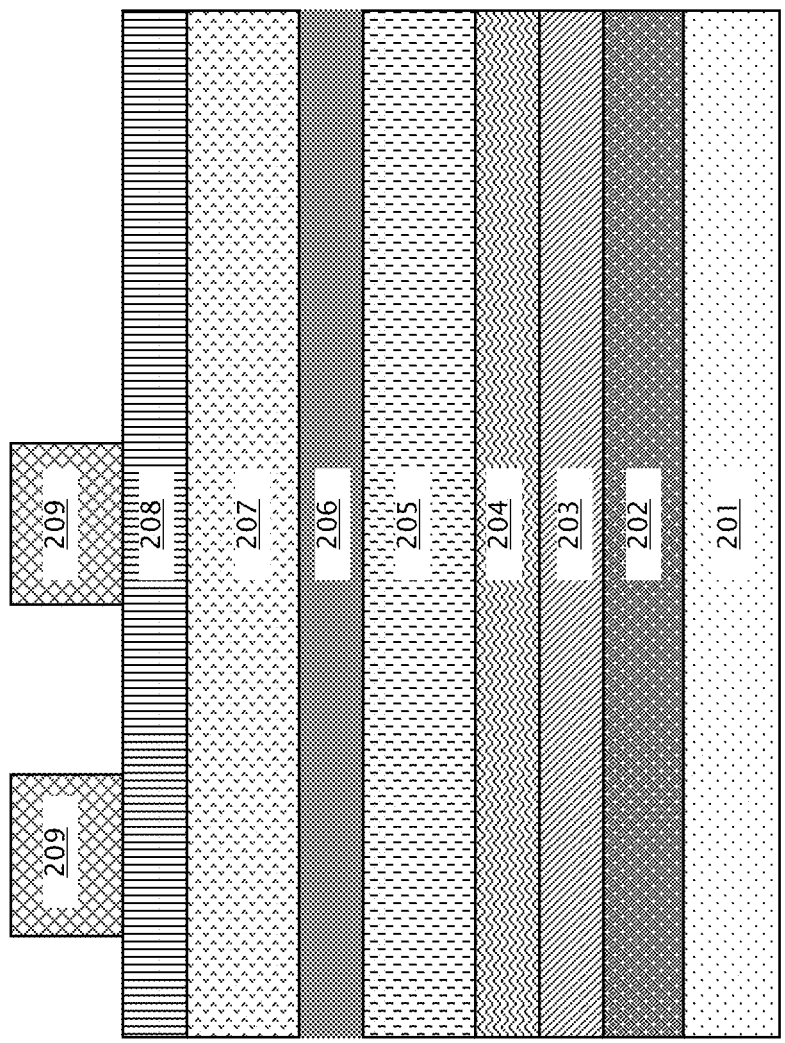
FIG. 2 is a cross sectional view illustrating an embodiment of a film stack including a metal hardmask layer after deposition of an organic planarization layer (OPL), silicon antireflective coating (SiARC), and photoresist corresponding to a mandrel mask.
Figure 3:
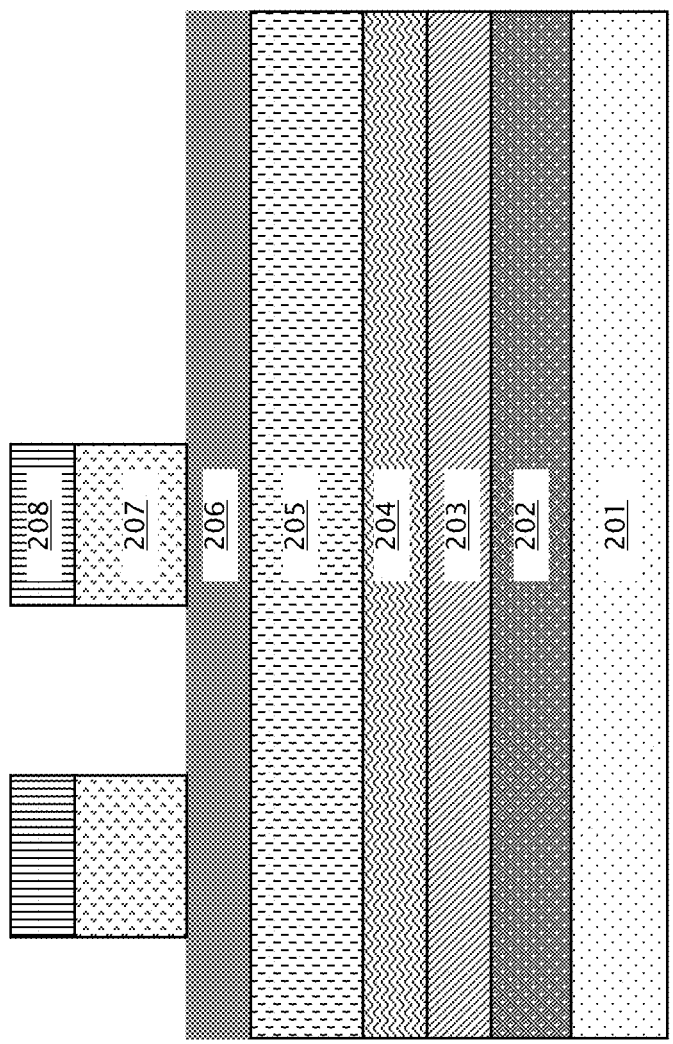
FIG. 3 is a cross sectional view illustrating an embodiment of the device of FIG. 2 after etching the OPL and the SiARC using the photoresist as a mask.
Figure 4:
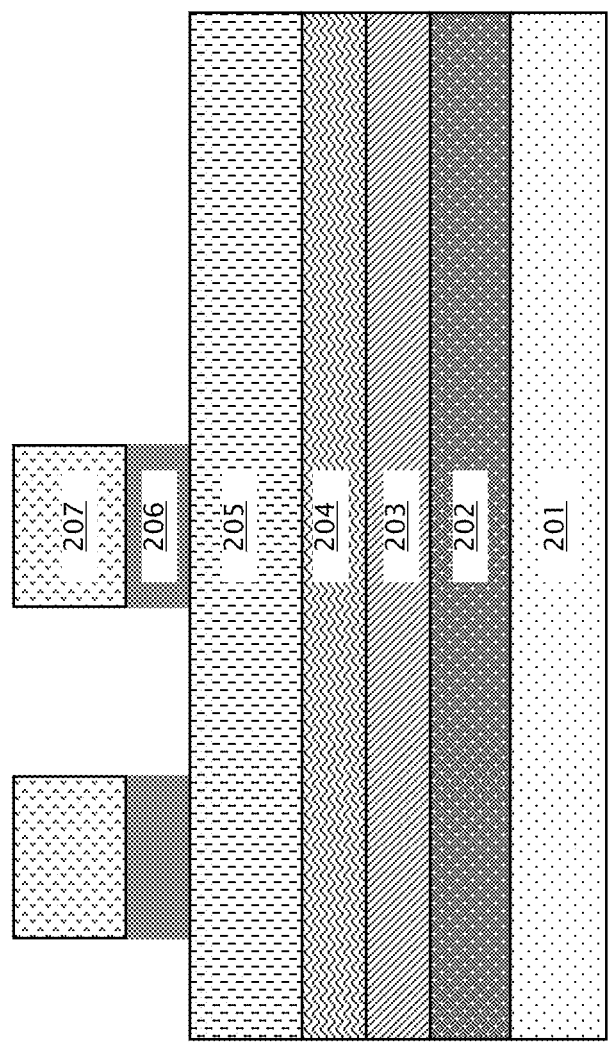
FIG. 4 is a cross sectional view illustrating an embodiment of the device of FIG. 3 after etching a cap layer and removing the SiARC.
Figure 5:
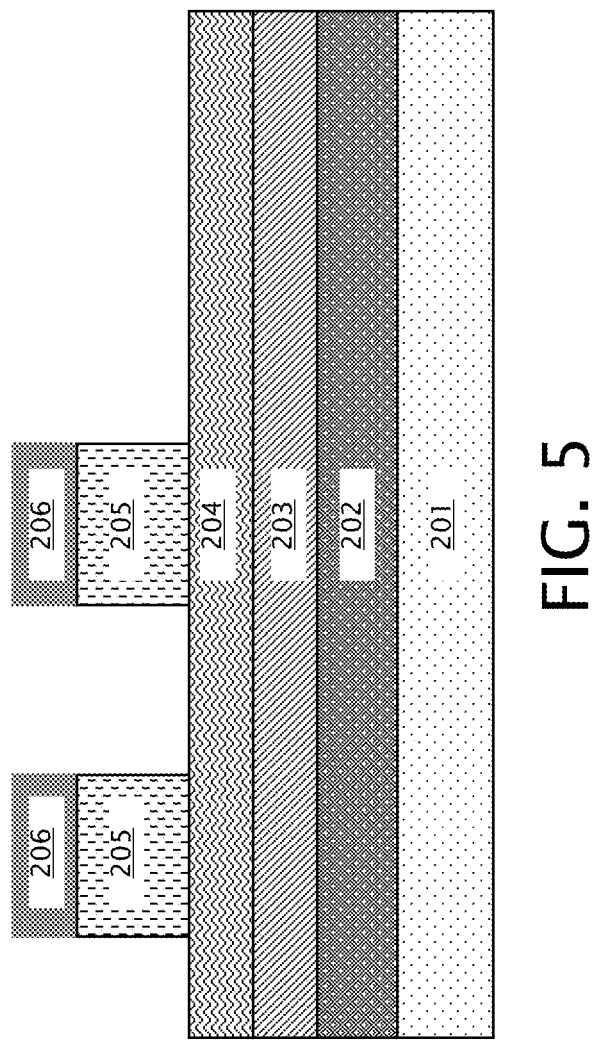
FIG. 5 is a cross sectional view illustrating an embodiment of the device of FIG. 4 after etching an amorphous carbon layer and removing the OPL.
Figure 6:
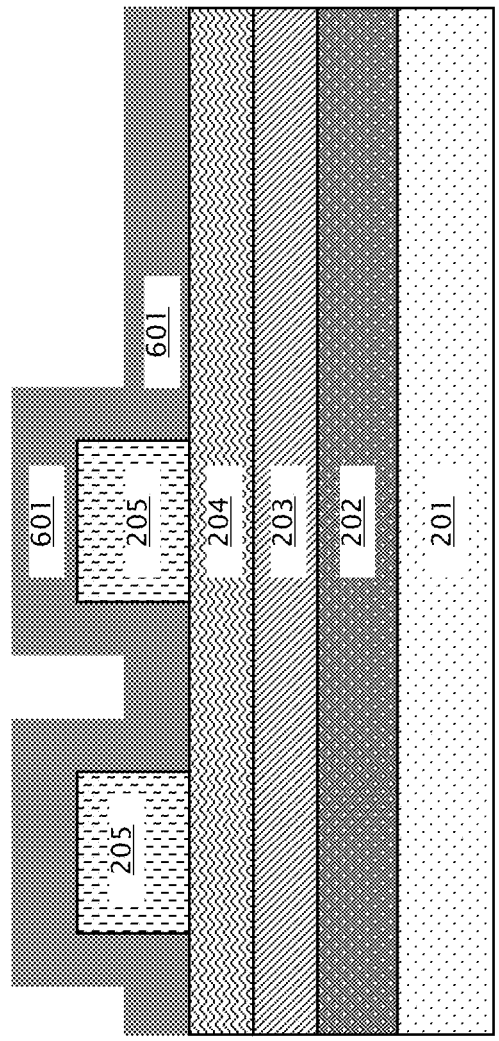
FIG. 6 is a cross sectional view illustrating an embodiment of the device of FIG. 5 after formation of an SIT spacer layer.
Figure 7:
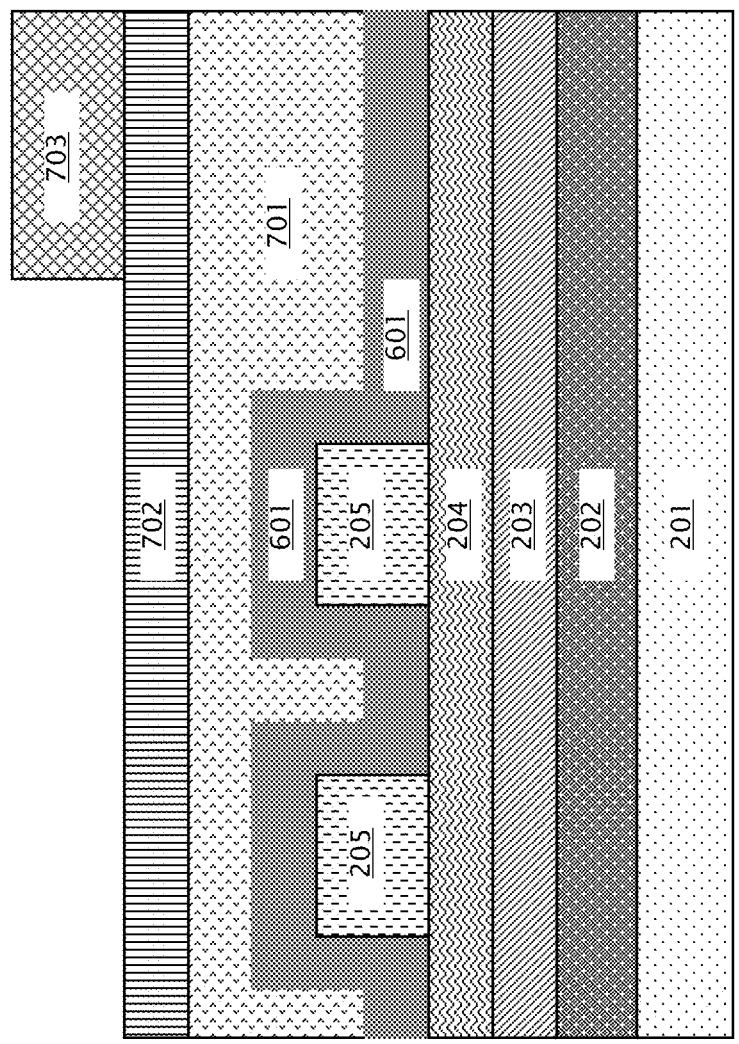
FIG. 7 is a cross sectional view illustrating an embodiment of the device of FIG. 6 after deposition of OPL, SiARC, and photoresist corresponding to a large feature (FX) mask.
Figure 8:
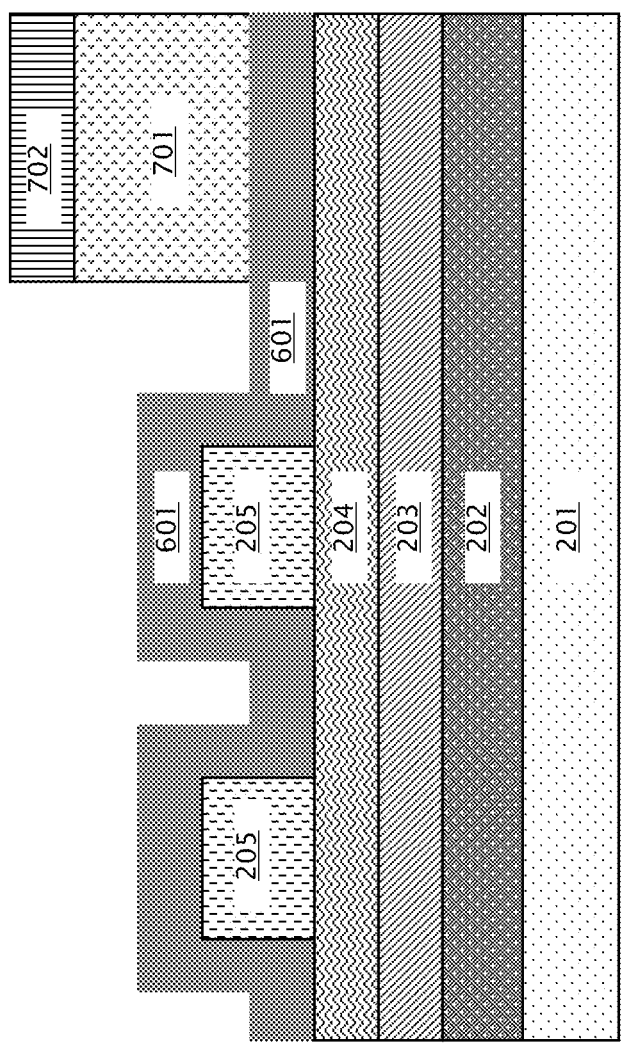
FIG. 8 is a cross sectional view illustrating an embodiment of the device of FIG. 7 after etching the OPL and SiARC, and removing the photoresist.
Figure 9:
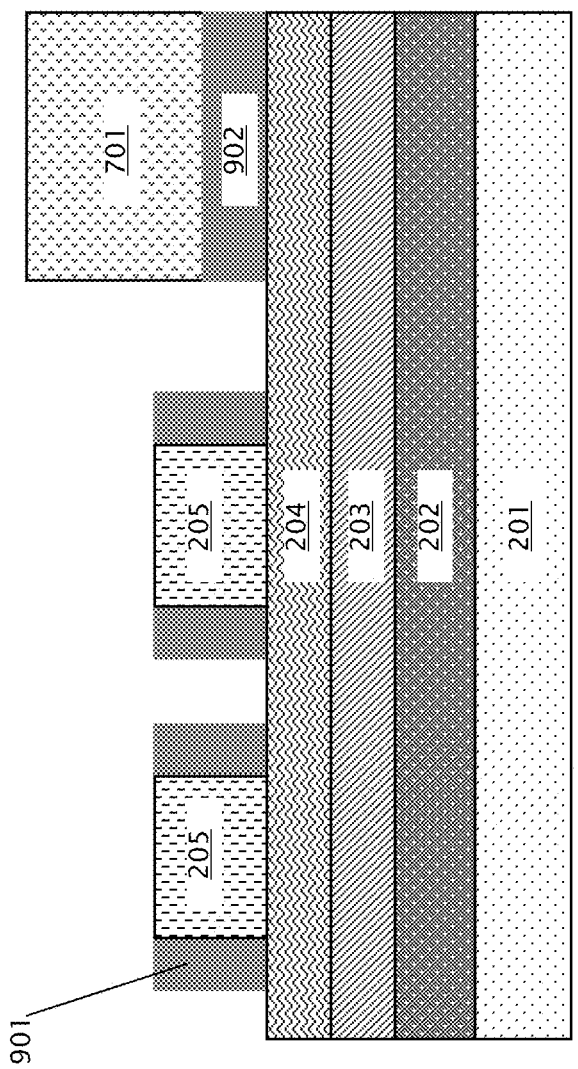
FIG. 9 is a cross sectional view illustrating an embodiment of the device of FIG. 8 after etching SIT spacer layer and removing the SiARC.
Figure 10:
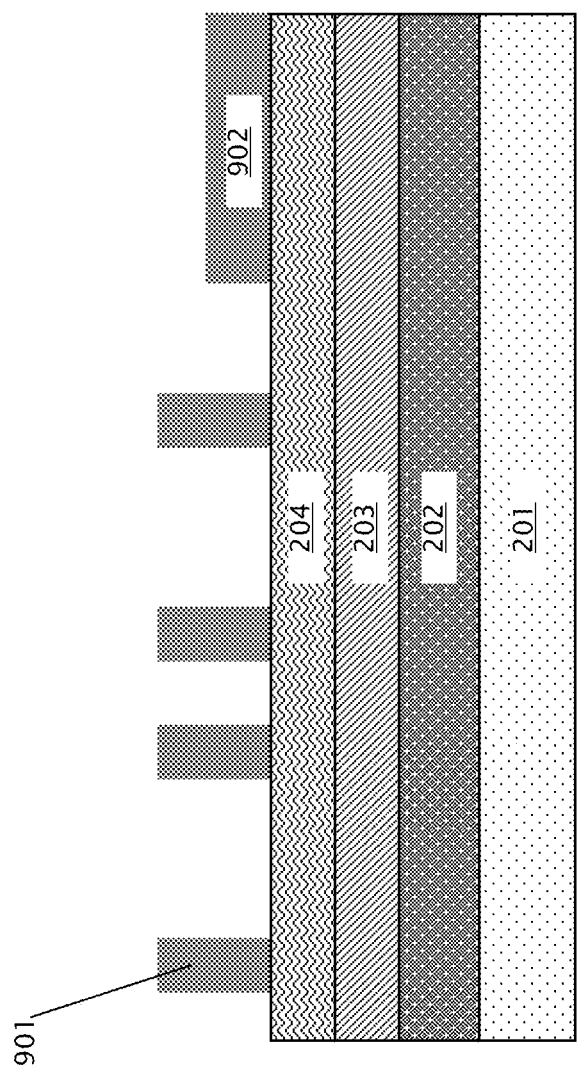
FIG. 10 is a cross sectional view illustrating an embodiment of the device of FIG. 9 after removal of the amorphous carbon and the OPL.

FIG. 1 shows a flowchart of another embodiment of a method 100 for FinFET formation using SIT and a metal hardmask layer, in which a mandrel mask and an FX mask are transferred into the metal hardmask layer and then into the SOI, and a cut mask is applied afterwards. FIG. 1 is discussed with reference to FIGS. 2-19. First, in block 101 of method 100, a mandrel mask and an FX mask are formed on a metal hardmask layer that is part of a film stack. An embodiment of a process flow for mandrel and FX mask formation as is performed in the first embodiment of block 101 is illustrated with respect to FIGS. 2-10. FIG. 2 shows an embodiment of a film stack including a buried oxide (BOX) layer 201, a silicon on insulator (SOI) layer 202, a thermal oxide layer 203, the metal hardmask layer 204, an amorphous carbon layer 205, and a cap layer 206. The metal hardmask layer 204 may comprise titanium nitride (TiN) in some embodiments. The cap layer 206 may comprise silicon nitride in some embodiments. Patterned photoresist 209, organic planarization layer (OPL) 207, and silicon antireflective coating (SiARC) 208 corresponding to a mandrel mask are located on top of the cap layer 206 of the film stack. The SiARC layer 208 and the OPL 207 are then etched using the patterned photoresist layer 209 as a mask, and the photoresist 209 is removed, as shown in FIG. 3. Then, the cap layer 206 is etched using the etched OPL 207 as a mask, and the etched SiARC 208 is removed, as shown in FIG. 4. Then, as shown in FIG. 5, the amorphous carbon layer 205 is etched using the etched cap layer 206 as a mask, and the etched OPL 207 is removed. The etched amorphous carbon layer 205 comprises the mandrels which are used for SIT. A SIT spacer layer 601 is then deposited by conformal deposition over the etched amorphous carbon layer 205, as shown in FIG. 6. The SIT spacer layer 601 may comprise a nitride such as silicon nitride or an oxide such as silicon oxide in various embodiments. In some embodiments, the etched cap layer 206 is removed before formation of the SIT spacer layer 601. In other embodiments, the SIT spacer layer 601 and the etched cap layer 206 comprise the same material (for example, silicon nitride), and the etched cap layer 206 is not removed before formation of SIT spacer layer 601, but instead becomes part of the SIT spacer layer 601. Then, proceeding to FIG. 7, OPL 701, SiARC 702, and photoresist 703 corresponding to the FX mask are formed over the SIT spacer layer 601. The OPL 701 and SiARC 702 are then etched using the patterned photoresist 703 as a mask, as shown in FIG. 8; photoresist 703 is removed during the etch of OPL 701. SIT spacer layer 601 is etched to form sidewall spacers 901 and FX mask 902, as shown in FIG. 9. The etchback of SIT spacer layer 601 may comprise an anisotropic fluorocarbon etch. SiARC 702 may be removed during etchback of SIT spacer layer 601. The etched amorphous carbon layer 205 and OPL 701 are then removed as shown in FIG. 10, leaving sidewall spacers 901 (which comprise the mandrel mask) and FX mask 902 located on metal hardmask layer 204. In some embodiments, the spacer layer 601 etch and the removal of the mandrel amorphous carbon layer 205 (i.e., the mandrel pull) to form the sidewall spacers corresponding to the mandrel mask may be performed before the OPL 701, SiARC 702, and photoresist 703 corresponding to the FX mask are formed on the metal hardmask layer 204.

Figure 11:
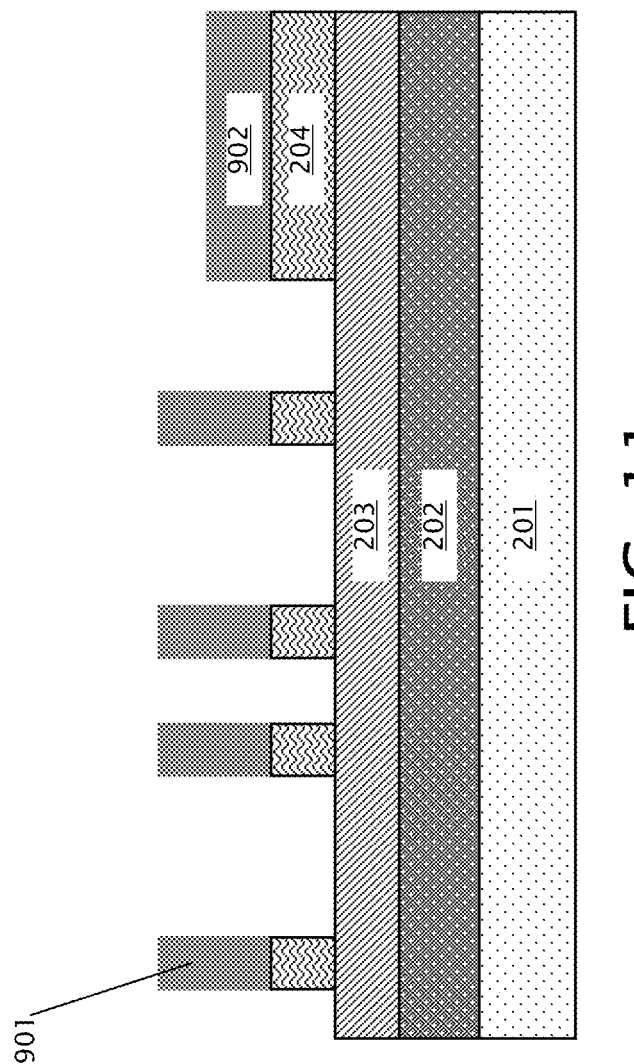
FIG. 11 is a cross sectional view illustrating an embodiment of the device of FIG. 10 after etching the metal hardmask layer.
Figure 12:
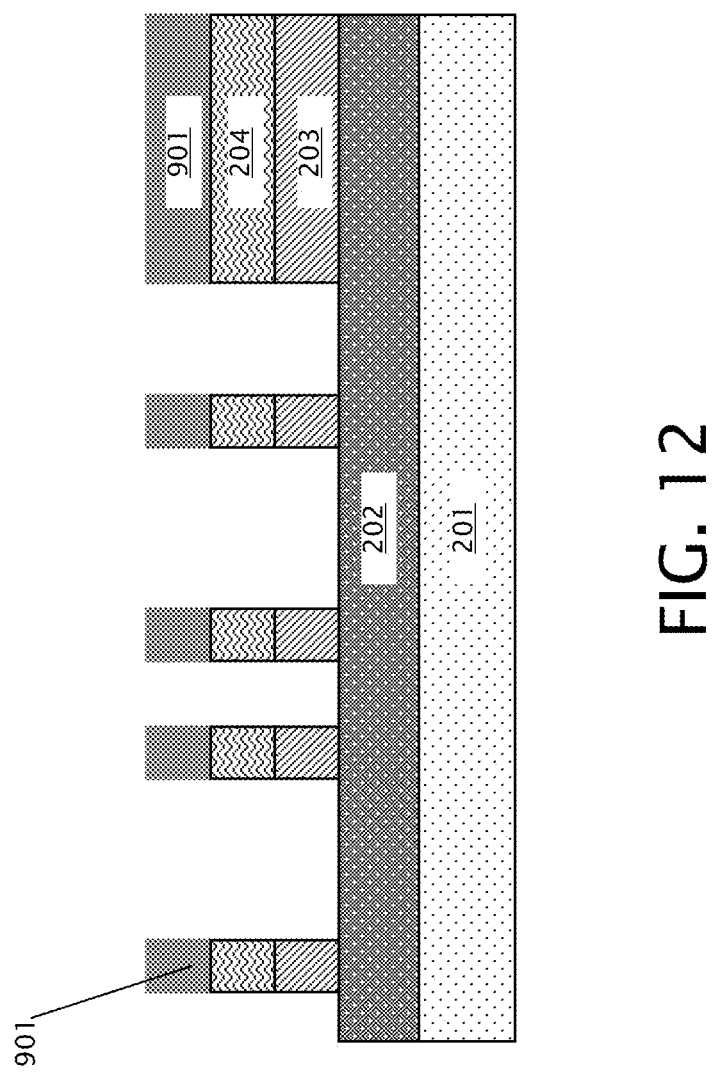
FIG. 12 is a cross sectional view illustrating an embodiment of the device of FIG. 11 after etching the thermal silicon oxide layer.

Method 100 of FIG. 1 then proceeds to block 102, in which the mandrel mask and FX mask are etched into the metal hardmask layer. As shown in FIG. 11, metal hardmask layer 204 is etched using sidewall spacers 901 and FX mask 902 as a mask to form etched metal hardmask layer 204 as shown in FIG. 12.

Figure 13:
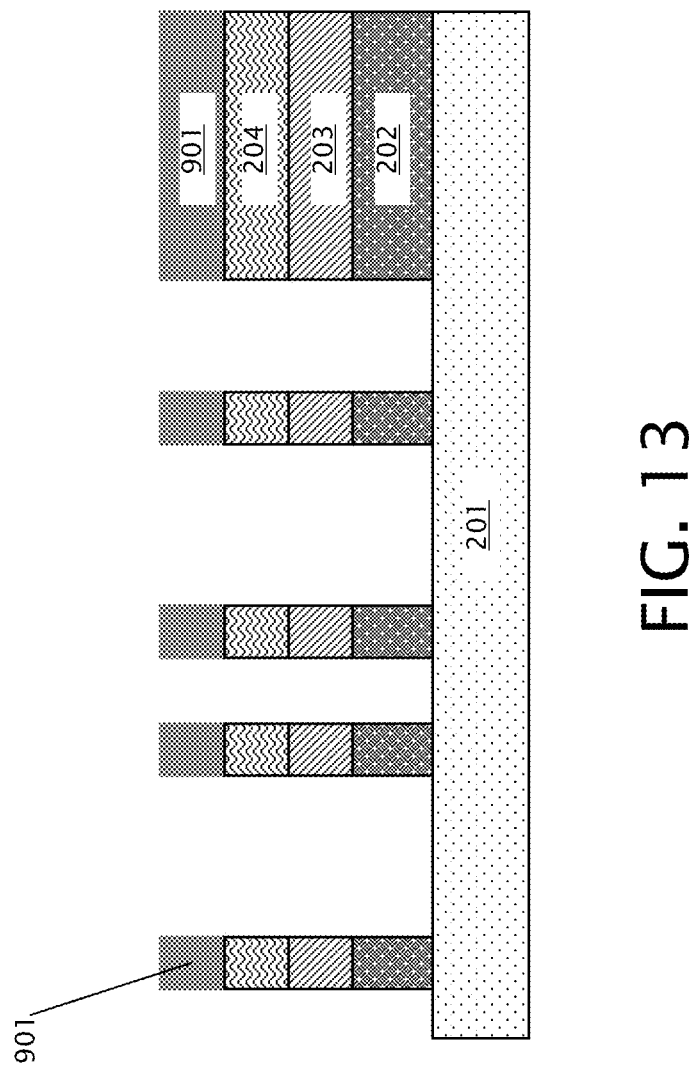
FIG. 13 is a cross sectional view illustrating an embodiment of the device of FIG. 12 after etching the SOI layer.
Figure 14:
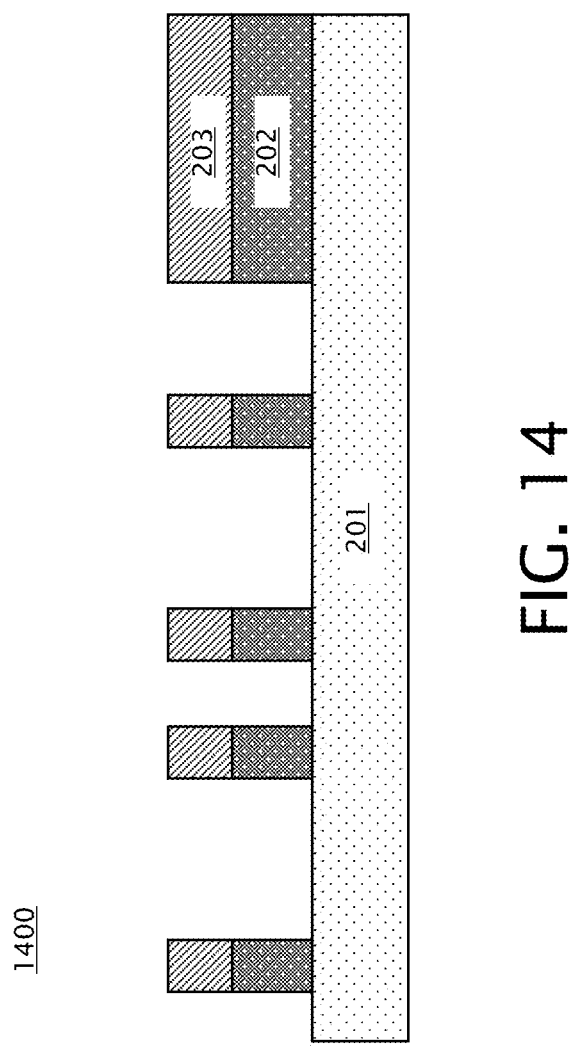
FIG. 14 is a cross sectional view illustrating an embodiment of the device of FIG. 13 after removing the SIT spacer layer and metal hardmask layer.

After the mandrel and FX masks are etched into the metal hardmask layer, then, referring again to method 100 of FIG. 1, the etched metal hardmask layer is used to etch the mandrel and FX masks into the SOI layer in block 103. An embodiment of a process flow for mask transfer into the SOI as is performed in block 103 is illustrated with respect to FIGS. 12-14. First, as shown in FIG. 12, the thermal oxide layer 203 is etched using the etched metal hardmask layer 204 as a mask. Then, as shown in FIG. 13, the SOI layer 202 is etched using the etched metal hardmask layer 204. Finally, as shown in FIG. 14, the sidewall spacers 901, FX mask 902 and the metal hardmask layer 204 are removed, leaving device 1400, which includes thermal oxide layer 203 and SOI layer 202 into which mandrel and FX masks have been simultaneously etched. Simultaneous etching of the various masks into the SOI 202 maintains the integrity of the thermal oxide layer 203. In embodiments in which the spacer 901 is SiN, and the hardmask 204 layer is TiN, both layers may be removed using a hot phosphoric acid solution.

Figure 15:
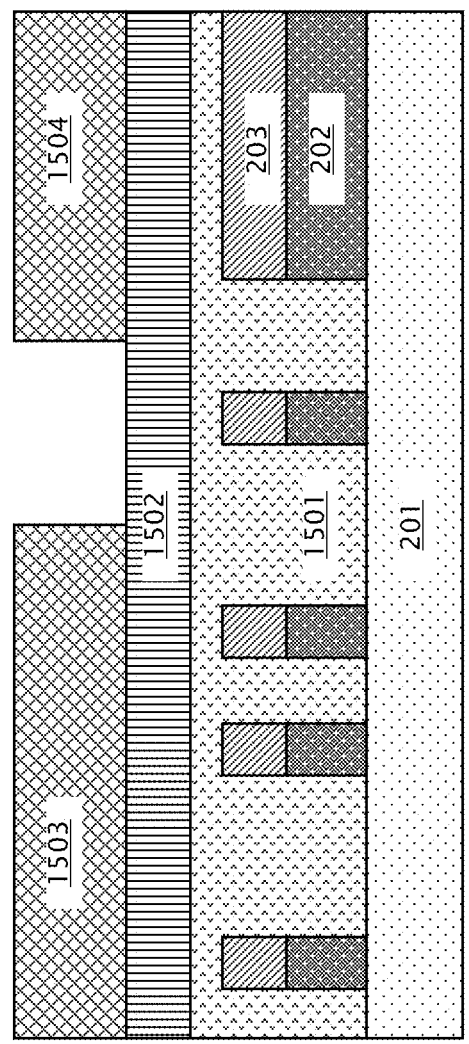
FIG. 15 is a cross sectional view illustrating an embodiment of the device of FIG. 14 after deposition of OPL, SiARC, and photoresist corresponding to a cut mask.
Figure 16:
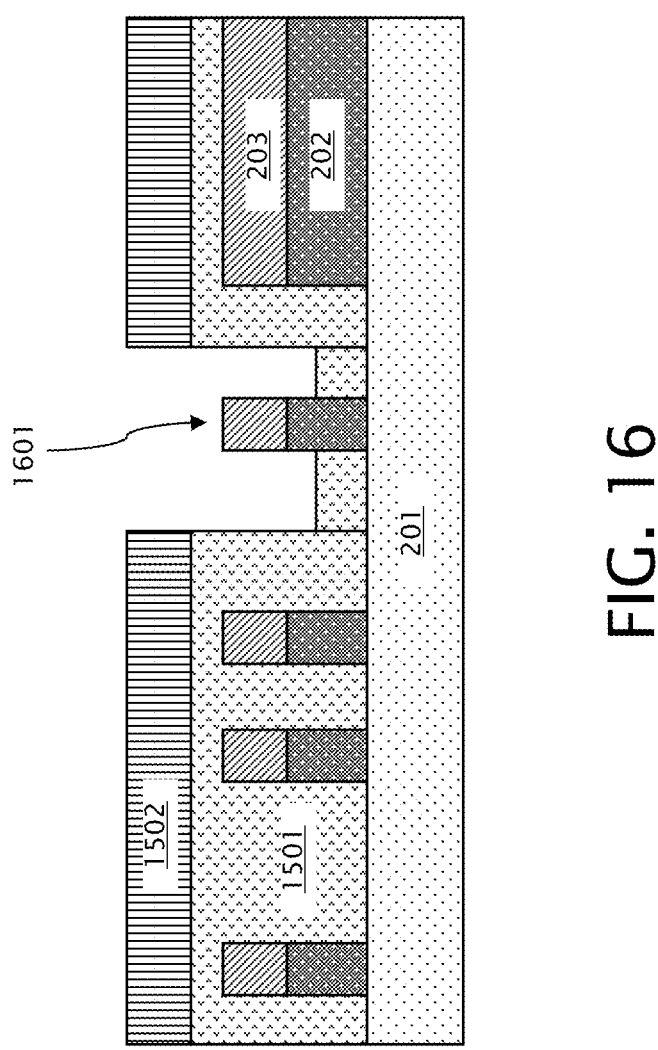
FIG. 16 is a cross sectional view illustrating an embodiment of the device of FIG. 15 after etching of the SiARC and the OPL.
Figure 17:
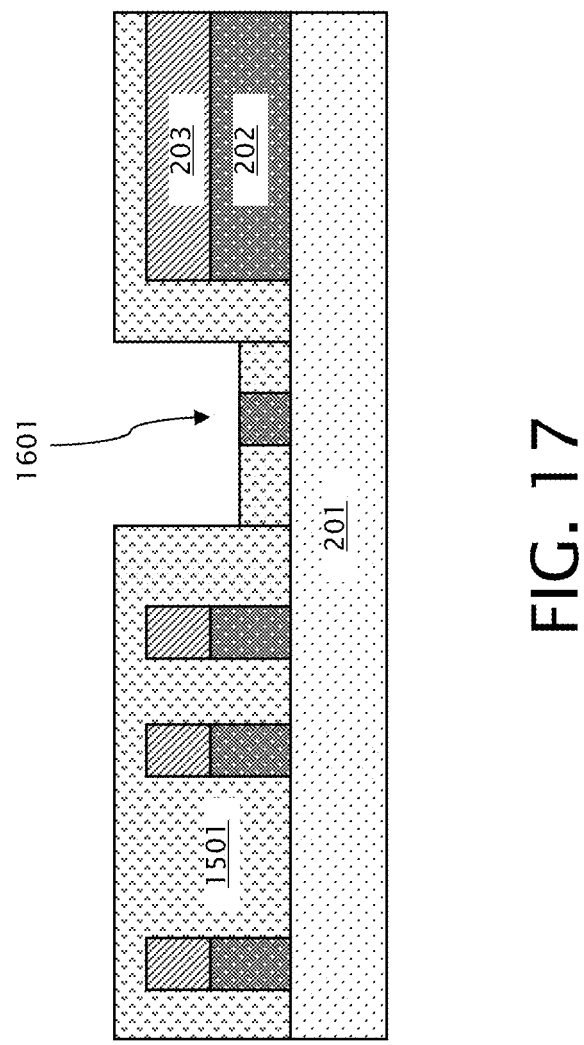
FIG. 17 is a cross sectional view illustrating an embodiment of the device of FIG. 16 after removal of a thermal silicon oxide portion of an unnecessary feature and removal of the SiARC.
Figure 18:
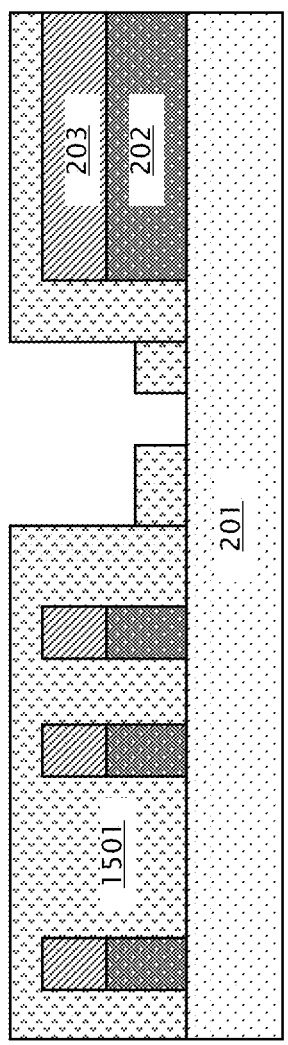
FIG. 18 is a cross sectional view illustrating an embodiment of the device of FIG. 17 after removal of a SOI portion of an unnecessary feature.
Figure 19:
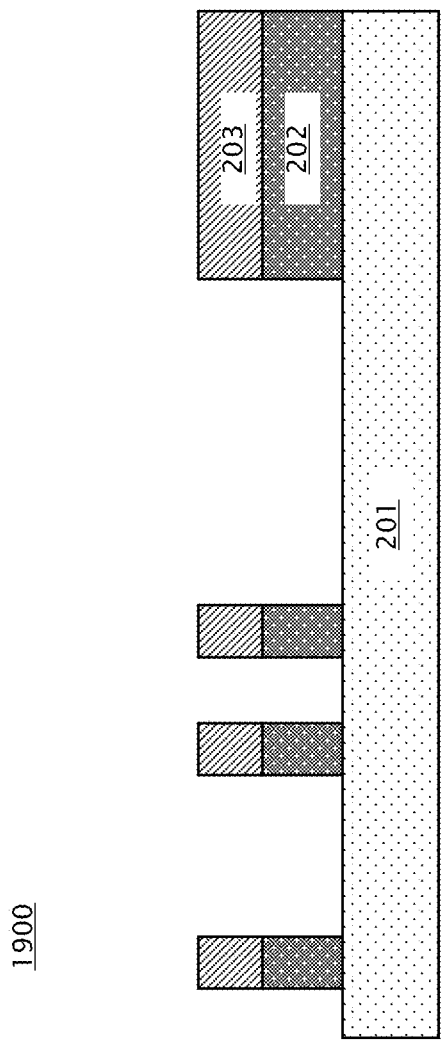
FIG. 19 is a cross sectional view illustrating an embodiment of the device of FIG. 18 after removal of the OPL.

Turning again to method 100 of FIG. 1, in block 104 a cut mask is applied to remove any unnecessary features that were formed by the mandrel and/or FX masks. An embodiment of a process flow for cut mask formation as is performed in block 104 is illustrated with respect to FIGS. 15-19. First, as shown in FIG. 15, OPL 1501, SiARC 1502, and photoresist 1503 are spin coated over the etched SOI 202 and thermal oxide layer 203. Then, as shown in FIG. 16, the full SiARC layer 1502 and OPL layer 1501 are etched to expose any unnecessary features, such as feature 1601, in etched SOI 202 and etched thermal oxide layer 203. The OPL layer may be etched partially in some embodiments. The SiARC etch may include a fluorocarbon gas etch in some embodiments. The OPL etch may include oxygen-containing plasmas, such as $O_2$, CO2, $CO_2/N_2$, or $CO_2/CO$; or non-oxygen-containing plasmas such as $H_2/N_2$. The photoresist 1503 may also be removed during the etch of OPL 1501. The exposed features, such as feature 1601, are then removed, as shown in FIGS. 17-18. The top thermal oxide portion of the exposed features may be removed first (FIG. 17), and then the bottom SOI portion (FIG. 18). In one example, the exposed $SiO_2$ and the SiARC layer are removed using fluorocarbon containing plasmas; and the SOI portion is removed in $Cl_2$ and/or HBr containing plasmas. The SiARC layer 1502 may also be removed during the removal of the thermal oxide portion of the exposed features. Lastly, as shown in FIG. 19, the remaining OPL 1501 is removed, leaving device 1900, on which FinFETs having relatively low thermal oxide thickness variation may be formed.

Figure 20:
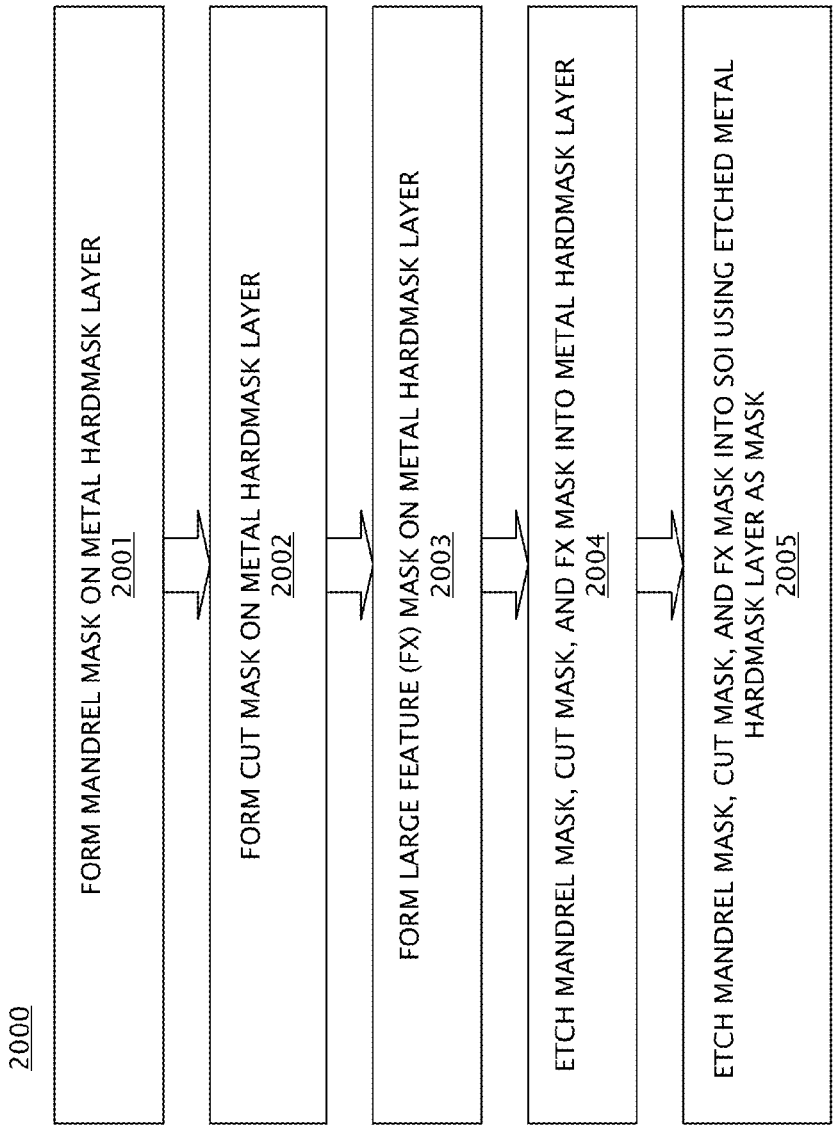
FIG. 20 illustrates a flowchart of an embodiment of a method for FinFET formation using SIT and a film stack including a metal hardmask layer.
Figure 21:
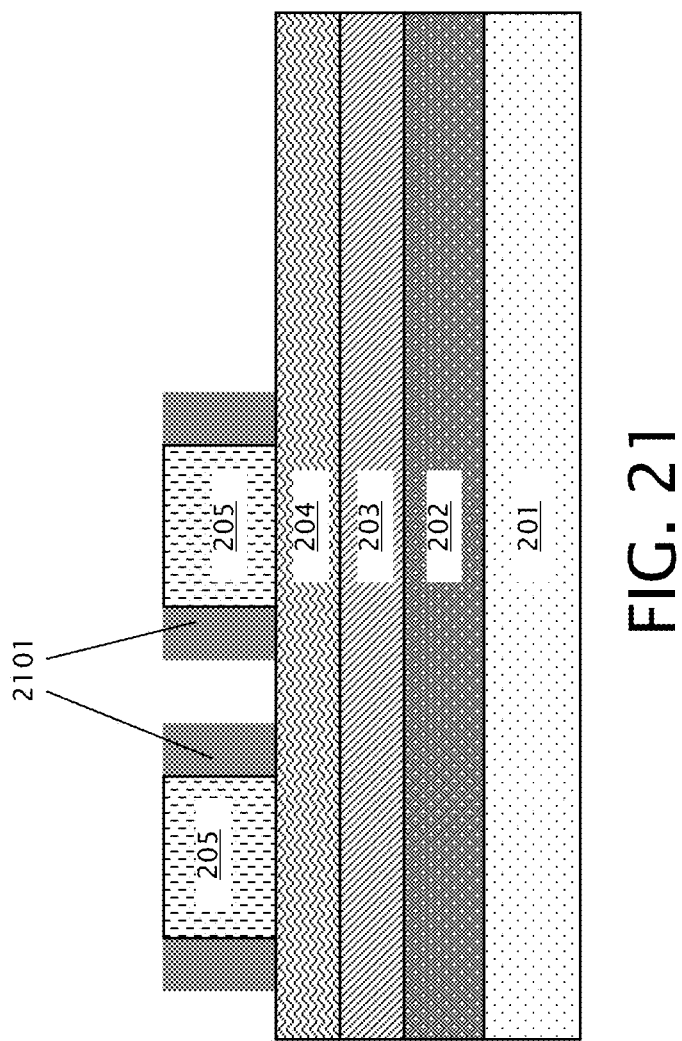
FIG. 21 is a cross sectional view illustrating an embodiment of the device of FIG. 6 after etchback of the SIT spacer.
Figure 22:
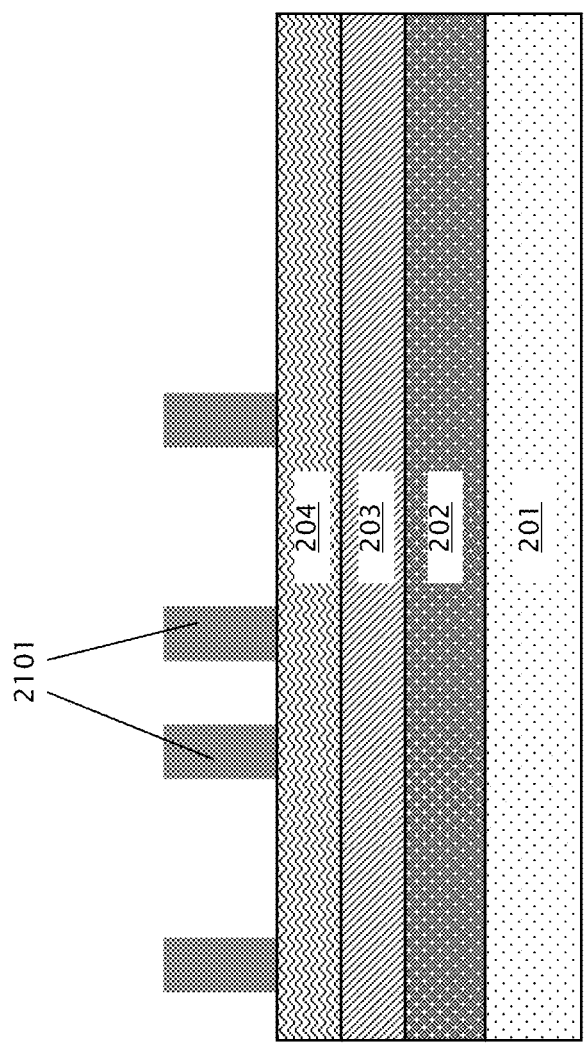
FIG. 22 is a cross sectional view illustrating an embodiment of the device of FIG. 21 after mandrel pull.

FIG. 20 shows a flowchart of another embodiment of a method 2000 for FinFET formation using SIT and a metal hardmask layer, in which a mandrel mask, cut mask and an FX mask are transferred into the metal hardmask layer and then into the SOI. FIG. 20 is discussed with reference to FIGS. 2-6 and 21-32. First, in block 2001 of method 2000, a mandrel mask is formed on a metal hardmask layer that is part of a film stack. An embodiment of a process flow for mandrel and FX mask formation as is performed in the first embodiment of block 2001 is illustrated with respect to FIGS. 2-6 and 21-22. FIG. 2 shows an embodiment of a film stack including a BOX layer 201, a SOI layer 202, a thermal oxide layer 203, the metal hardmask layer 204, an amorphous carbon layer 205, and a cap layer 206. The metal hardmask layer 204 may comprise TiN in some embodiments. The cap layer 206 may comprise silicon nitride in some embodiments. Patterned photoresist 209, organic planarization layer (OPL) 207, and silicon antireflective coating (SiARC) 208 corresponding to a mandrel mask are located on top of the cap layer 206 of the film stack. The SiARC layer 208 and the OPL 207 are then etched using the patterned photoresist layer 209 as a mask, and the photoresist 209 is removed, as shown in FIG. 3. Then, the cap layer 206 is etched using the etched OPL 207 as a mask, and the etched SiARC 208 is removed, as shown in FIG. 4. Then, as shown in FIG. 5, the amorphous carbon layer 205 is etched using the etched cap layer 206 as a mask, and the etched OPL 207 is removed. The etched amorphous carbon layer 205 comprises the mandrels which are used for SIT. A SIT spacer layer 601 is then deposited by conformal deposition over the etched amorphous carbon layer 205, as shown in FIG. 6. The SIT spacer layer 601 may comprise a nitride such as silicon nitride or an oxide such as silicon oxide in various embodiments. In some embodiments, the etched cap layer 206 is removed before formation of the SIT spacer layer 601. In other embodiments, the SIT spacer layer 601 and the etched cap layer 206 comprise the same material (for example, silicon nitride), and the etched cap layer 206 is not removed before formation of SIT spacer layer 601, but instead becomes part of the SIT spacer layer 601. Then, proceeding to FIG. 21, SIT spacer layer 601 is etched to form sidewall spacers 2101. The etchback of SIT spacer layer 601 may comprise an anisotropic fluorocarbon etch. The etched amorphous carbon layer 205 is then removed as shown in FIG. 22, leaving sidewall spacers 2101 (which comprise the mandrel mask) located on metal hardmask layer 204.

Figure 23:
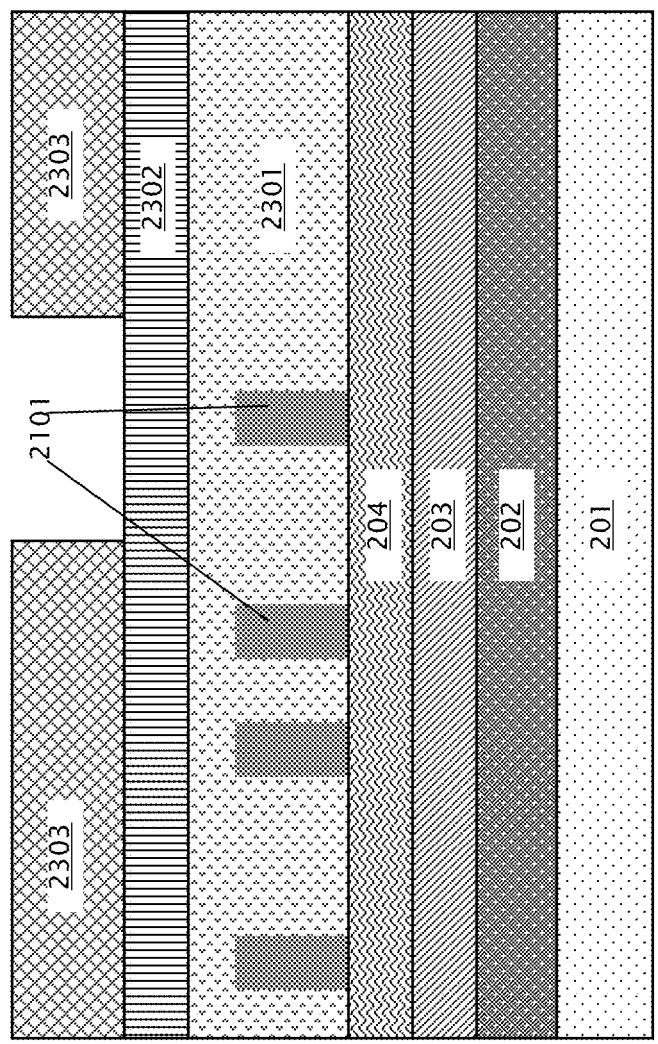
FIG. 23 is a cross sectional view illustrating an embodiment of the device of FIG. 22 after deposition of OPL, SiARC, and photoresist corresponding to a cut mask.
Figure 24:
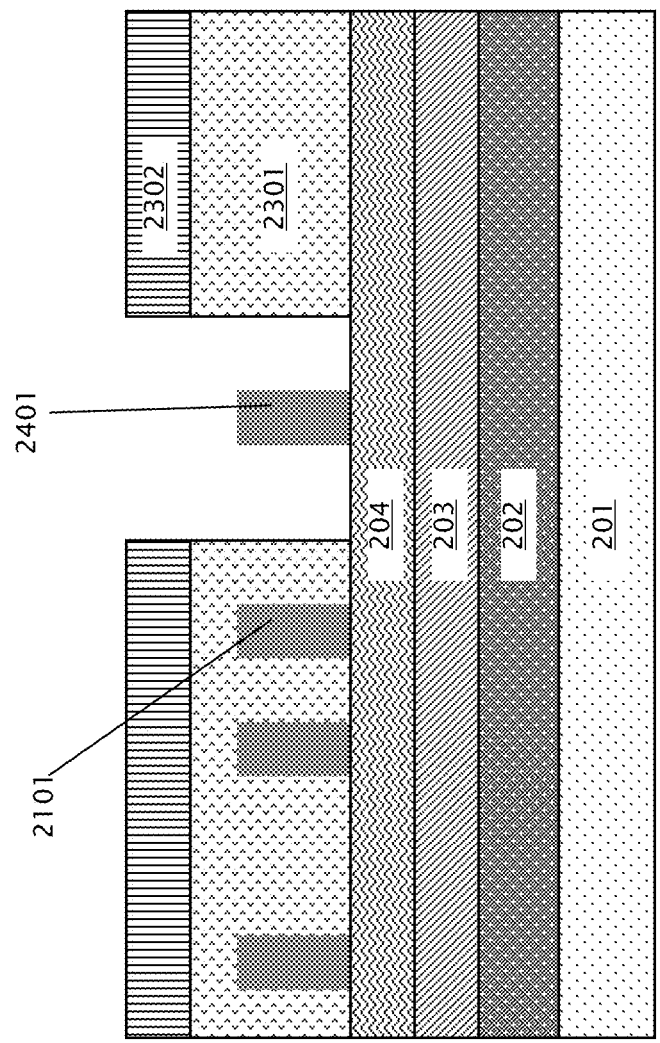
FIG. 24 is a cross sectional view illustrating an embodiment of the device of FIG. 23 after etching the OPL and SiARC, and removing the photoresist.
Figure 25:
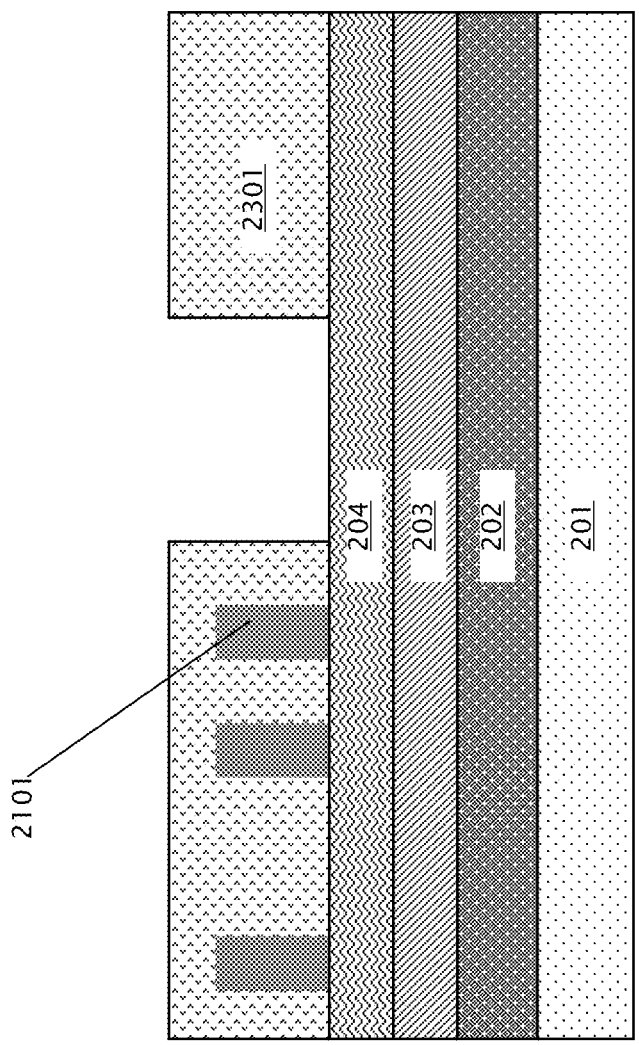
FIG. 25 is a cross sectional view illustrating an embodiment of the device of FIG. 24 after removal of unnecessary features and removal of the SiARC.
Figure 26:
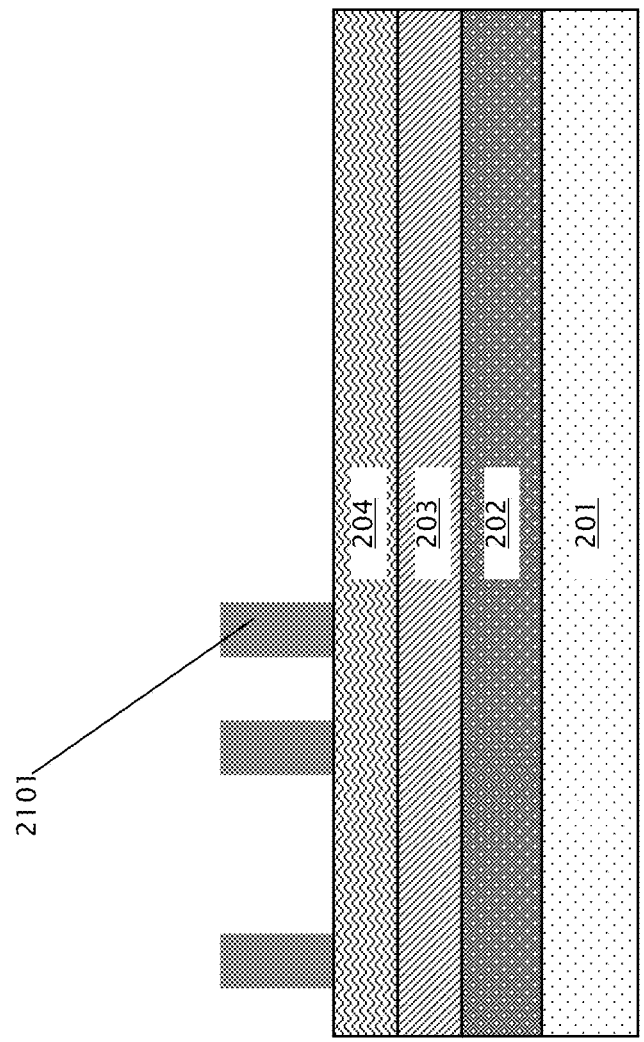
FIG. 26 is a cross sectional view illustrating an embodiment of the device of FIG. 25 after removal of the OPL.

Turning again to method 2000 of FIG. 20, a cut mask is then formed on the metal hardmask layer in block 2002. The cut mask functions to remove unnecessary features that were formed during mandrel mask formation in block 2001. An embodiment of a process flow for cut mask formation as is performed in block 2002 is illustrated with respect to FIGS. 23-26. First, as shown in FIG. 23, OPL 2301, SiARC 2302, and photoresist 2303 are deposited over sidewall spacers 601 and metal hardmask layer 204. Then, as shown in FIG. 24, the OPL 2301 and SiARC 2302 are etched to expose the unnecessary sidewall spacers, such as sidewall spacer 2401, that are to be removed by the cut mask. The SiARC etch may include a fluorocarbon etch in some embodiments. The OPL etch may contain an oxygen-containing plasma, such as $O_2$, $CO_2/CO$, $CO_2/N_2$, or a non-oxygen containing plasma, such as $H_2/N_2$ mixture. The patterned photoresist 2303 acts as the masking layer for SiARC 2302 etch, and may be removed during the etch of OPL 2301. The OPL 2301 etch could be a full OPL etch or a partial OPL etch. The exposed sidewall spacers, such as sidewall spacer 2401, are then removed, as shown in FIG. 25. This may be performed using fluorocarbon chemistry based etch, for example. The remaining SiARC layer 2302 may also be removed during the removal of the exposed sidewall spacers 2401. Lastly, as shown in FIG. 26, the remaining OPL 2301 is removed. Remaining sidewall spacers 2101, which comprise the mandrel mask and the cut mask, are left on metal hardmask layer 204 at the end of block 2002 of method 2000.

Figure 27:
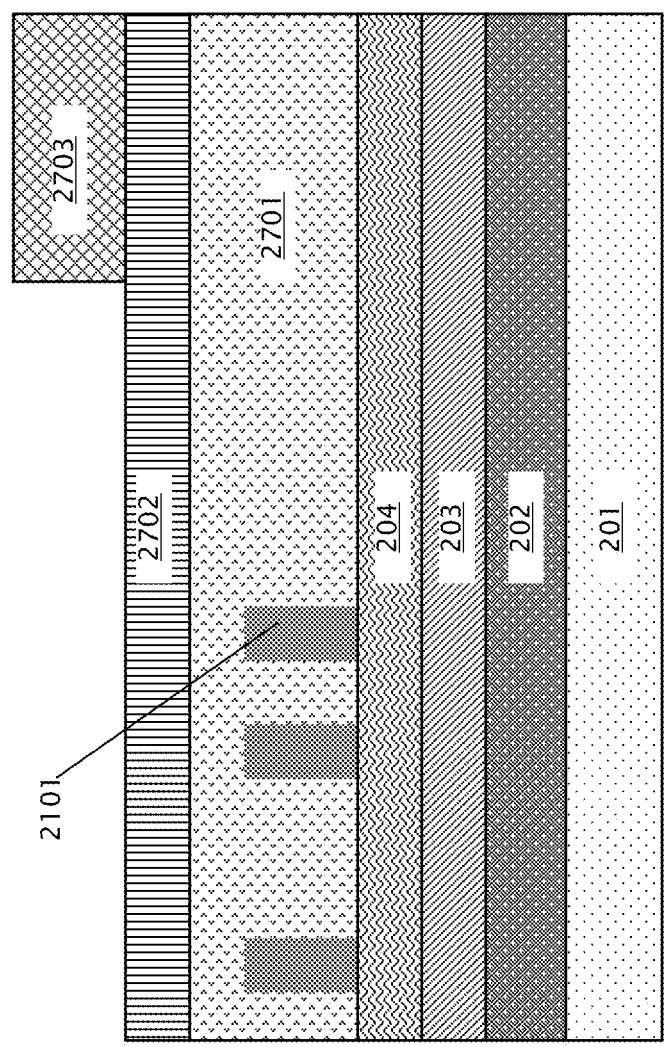
FIG. 27 is a cross sectional view illustrating an embodiment of the device of FIG. 26 after deposition of OPL, SiARC, and photoresist corresponding to a large feature (FX) mask.
Figure 28:
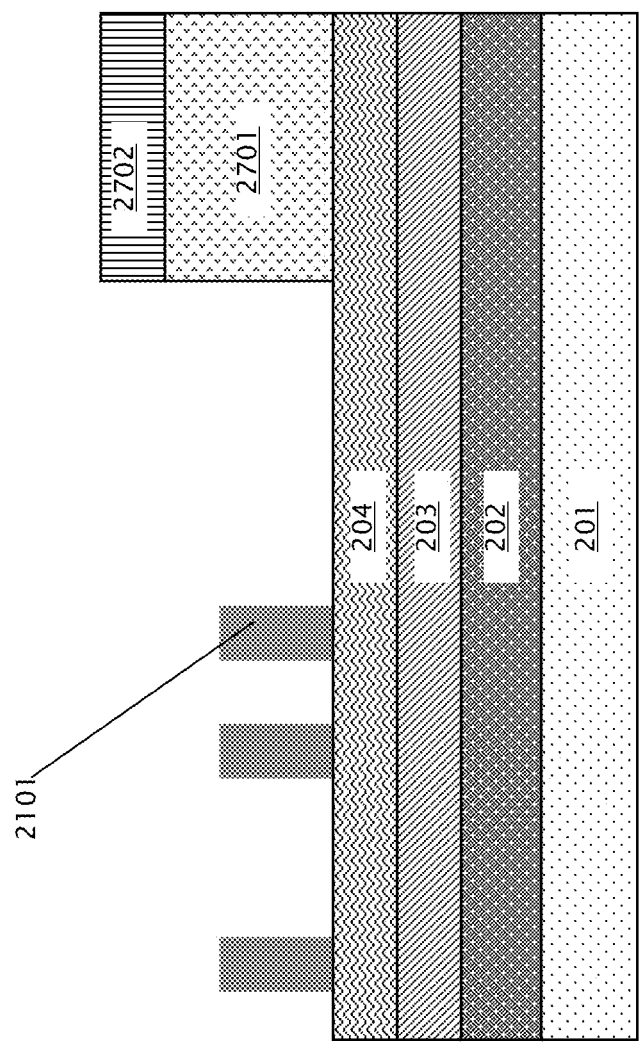
FIG. 28 is a cross sectional view illustrating an embodiment of the device of FIG. 27 after etching of the OPL and SiARC and removal of the photoresist.

Referring again to method 2000 of FIG. 20, a FX mask is then formed on the metal hardmask layer in block 2003. An embodiment of a process flow for FX mask formation as is performed in block 2003 is illustrated with respect to FIGS. 27-28. First, as shown in FIG. 27, OPL 2701, SiARC 2702, and photoresist 2703 are deposited over sidewall spacers 2101 and metal hardmask layer 204. Then, as shown in FIG. 28, the OPL 2701 and SiARC 2702 are etched to form the FX mask. The etch of OPL 2701 is selected such that the sidewall spacers 601 are not removed by the etch of OPL 2701. The patterned photoresist 2703 may be removed during the etch of OPL 2701.

Figure 29:
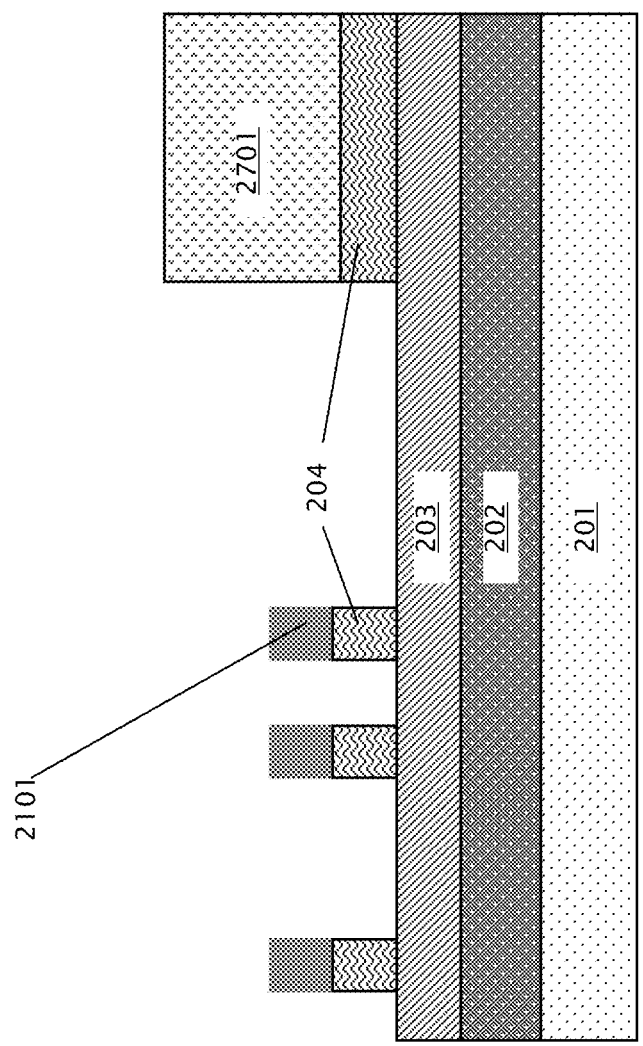
FIG. 29 is a cross sectional view illustrating an embodiment of the device of FIG. 28 after etching of the mandrel, cut, and FX masks into the metal hardmask layer.

Method 2000 of FIG. 20 then proceeds to block 2004, in which the mandrel, cut, and FX masks are etched into the metal hardmask layer, resulting in an etched metal hardmask layer. An embodiment of an etched metal hardmask layer 204 is shown in FIG. 29. SiARC layer 2702 may be removed during etching of metal hardmask layer 204, or may be separately removed afterwards in various embodiments. The sidewall spacers 2101 are also partially removed during etching of metal hardmask layer 204.

Figure 30:
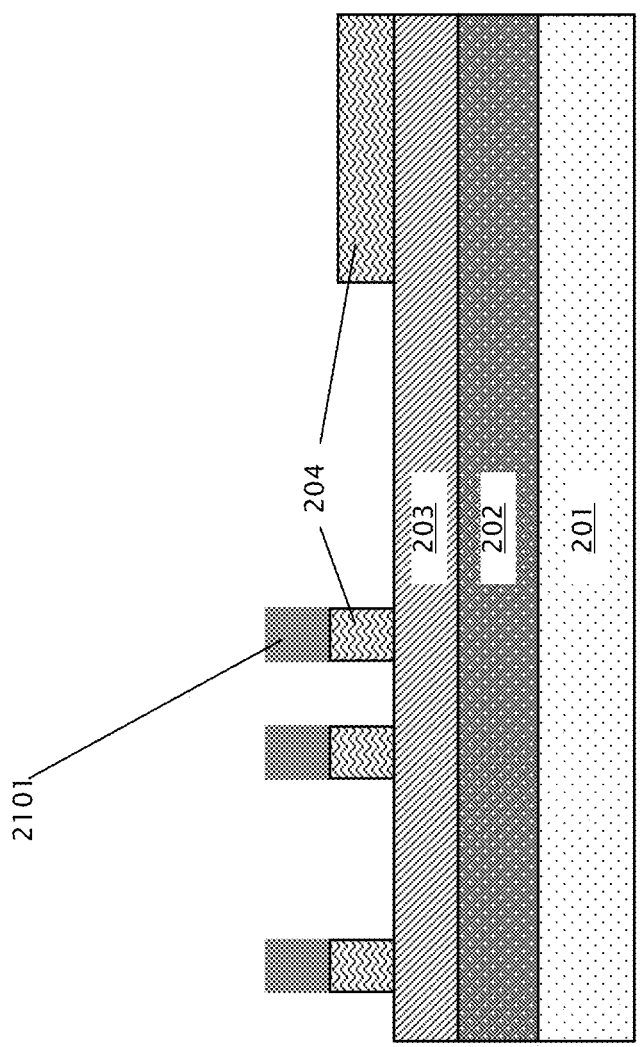
FIG. 30 is a cross sectional view illustrating an embodiment of the device of FIG. 29 after removal of the FX mask OPL.
Figure 31:
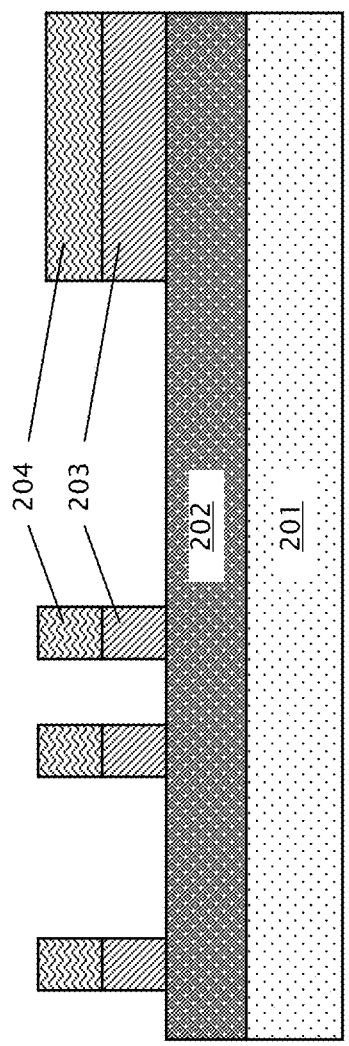
FIG. 31 is a cross sectional view illustrating an embodiment of the device of FIG. 30 after etching of the thermal silicon oxide layer and removal of the SIT spacer material corresponding to the mandrel mask.
Figure 32:
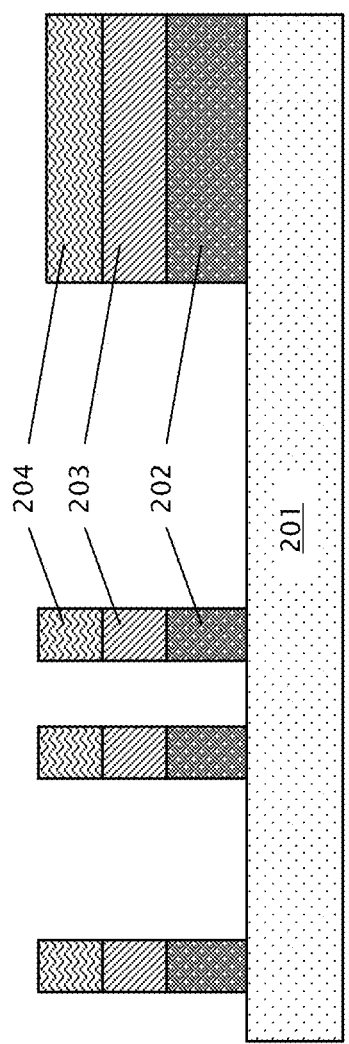
FIG. 32 is a cross sectional view illustrating an embodiment of the device of FIG. 31 after etching of the mandrel, cut, and FX masks into the SOI layer.
Figure 33:
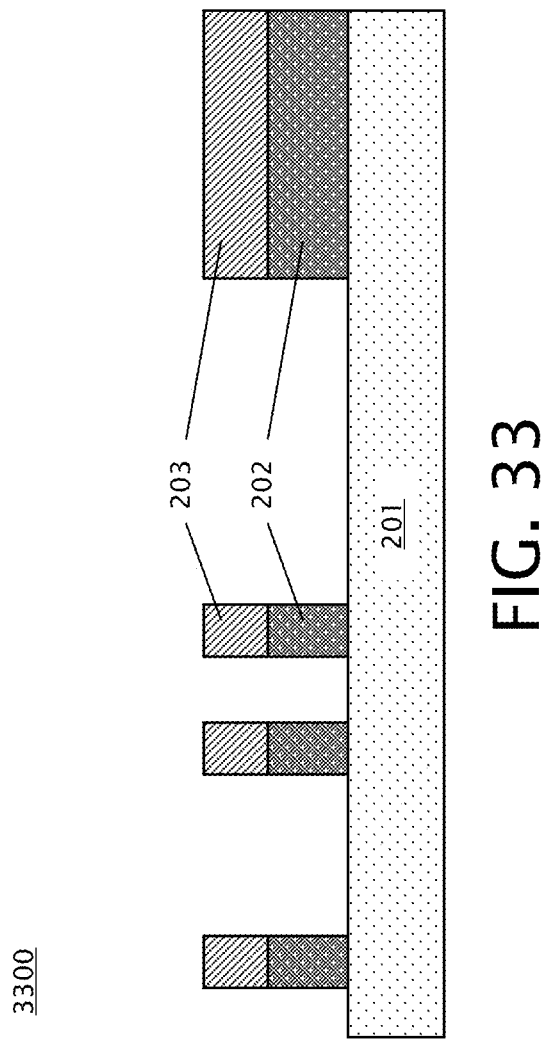
FIG. 33 is a cross sectional view illustrating an embodiment of the device of FIG. 32 after removal of the etched metal hardmask layer.

After the mandrel, cut, and FX masks are etched into the metal hardmask layer to form the etched metal hardmask layer, then, referring again to method 2000 of FIG. 20, the etched metal hardmask layer is used as a mask to etch the mandrel, cut, and FX masks into the SOI layer in block 2005. An embodiment of a process flow for mask transfer into the SOI as is performed in block 2005 is illustrated with respect to FIGS. 30-33. First, as shown in FIG. 30, the FX mask OPL layer 2701 is removed by a plasma etch. The OPL etch chemistry may include be oxygen containing plasmas, such as $O_2$, $CO_2/N_2$, $CO_2/O_2$, or $CO_2/CO$; or non-oxygen containing plasma, such as $H_2/N_2$. Then, as shown in FIG. 31, the thermal oxide layer 203 is etched using the etched metal hardmask layer 204 as a mask. The sidewall spacer layer 2101 that comprises the mandrel mask may be removed at the end of oxide layer 203 patterning. Then, as shown in FIG. 32, the SOI layer 202 is etched using the etched metal hardmask layer 204 as the masking layer. Finally, as shown in FIG. 33, the metal hardmask layer 204 is removed, leaving device 3300, which includes thermal oxide layer 203 and SOI layer 202 into which mandrel, cut, and FX masks have been simultaneously etched. Simultaneous etching of the various masks into the SOI 202 maintains the integrity of the thermal oxide layer 203, allowing formation of FinFETs with relatively low thermal oxide thickness variation on device 3200.

The technical effects and benefits of exemplary embodiments include formation of FinFETs by SIT with relatively low thermal oxide thickness variation, which may increase the yield for a fabrication process for devices including FinFETs.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for formation of a fin field effect transistor (FinFET) device, the method comprising:
   forming a mandrel mask and a large feature (FX) mask on a metal hardmask layer of a film stack, the film stack comprising a silicon on insulator (SOI) layer located underneath the metal hardmask layer and an amorphous carbon layer located on top of the metal hardmask layer, wherein forming the mandrel mask and the FX mask comprises:
      etching the amorphous carbon layer to form a plurality of mandrels on the metal hardmask layer;
      depositing a sidewall image transfer (SIT) spacer layer over the plurality of mandrels and on the metal hardmask layer;
      performing etchback of the SIT spacer layer to expose top surfaces of the plurality of mandrels; and
      removing the plurality of mandrels, wherein a portion of the SIT spacer layer that remains on the metal hardmask layer comprises the mandrel mask;
   etching the mandrel mask and the FX mask simultaneously into the metal hardmask layer; and
   etching the mandrel mask and the FX mask into the SOI layer using the etched metal hardmask layer as a mask.

2. The method of claim 1, wherein the film stack further comprises:
   a buried oxide (BOX) layer located underneath the SOI layer;
   a thermal silicon oxide layer located on top of the SOI layer and underneath the metal hardmask layer; and
   a cap layer located on top of the amorphous carbon layer.

3. The method of claim 1, wherein the SIT spacer layer comprises one of silicon oxide and silicon nitride, and is deposited by conformal deposition.

4. The method of claim 1, wherein the FX mask is formed on the SIT spacer layer before etchback of the SIT spacer layer is performed, such that a portion of the SIT spacer layer comprises the FX mask.

5. The method of claim 1, further comprising forming a cut mask over the etched SOI layer after etching the mandrel mask and the FX mask into the SOI layer, wherein the cut mask is configured to remove an unnecessary feature formed by the mandrel mask or the FX mask in the SOI layer.

6. The method of claim 1, further comprising forming a cut mask on the metal hardmask layer before etching the mandrel mask and the FX mask into the metal hardmask layer, wherein the cut mask is configured to remove a portion of the mandrel mask or the FX mask corresponding to an unnecessary feature.

7. The method of claim 1, wherein the metal hardmask layer comprises titanium nitride (TiN).

8. The method of claim 2, wherein the cap layer comprises silicon nitride.

9. The method of claim 2, wherein the cap layer comprises the same material as the SIT spacer layer, and wherein the cap layer is not removed before deposition of the SIT spacer layer.

10. The method of claim 2, wherein the cap layer comprises a different material from the SIT spacer layer, and wherein the cap layer is removed before deposition of the SIT spacer layer.

11. The method of claim 2, wherein the mandrel mask and the FX mask are etched into the thermal silicon oxide layer using the etched metal hardmask layer as a mask before etching the mandrel mask and the FX mask into the SOI layer.

12. A film stack for formation of a fin field effect transistor (FinFET) device, comprising:
   a buried oxide (BOX) layer;
   a silicon on insulator (SOI) layer located on the BOX layer;
   a thermal silicon oxide layer located on top of the SOI layer;
   a metal hardmask layer located on top of the thermal silicon oxide layer; and
   an amorphous carbon layer located on top of the metal hardmask layer, wherein the amorphous carbon layer comprises a plurality of mandrels corresponding to a mandrel mask located on the metal hardmask layer, and further comprising a sidewall image transfer (SIT) spacer layer located over the plurality of mandrels and the metal hardmask layer.

13. The film stack of claim 12, wherein the metal hardmask layer comprises titanium nitride (TiN).

14. The film stack of claim 12, further comprising a cap layer located on top of the amorphous carbon layer.

15. The film stack of claim 12, wherein the cap layer comprises silicon nitride.

16. The film stack of claim 12, further comprising a cap layer located on top of the amorphous carbon layer, wherein the cap layer comprises the same material as the SIT spacer layer.

17. The film stack of claim 12, wherein the SIT spacer layer comprises one of silicon oxide and silicon nitride.

18. The film stack of claim 12, wherein a portion of the SIT spacer layer comprises a large feature (FX) mask.

* * * * *